(12) United States Patent
Malek et al.

(10) Patent No.: US 8,576,569 B2
(45) Date of Patent: Nov. 5, 2013

(54) ELECTRONIC DEVICES HAVING MULTI-PURPOSE COWLINGS AND CO-AXIAL CABLE GROUNDING AND FIXTURE BRACKETS

(75) Inventors: Shayan Malek, Cupertino, CA (US); Dan Jarvis, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 312 days.

(21) Appl. No.: 12/987,973

(22) Filed: Jan. 10, 2011

(65) Prior Publication Data
US 2012/0176755 A1  Jul. 12, 2012

(51) Int. Cl.
*H05K 5/00* (2006.01)
(52) U.S. Cl.
USPC ........................................ 361/730; 361/799
(58) Field of Classification Search
USPC ......... 361/799, 801–803, 807, 809, 810, 816, 361/818, 728–730, 825, 826, 748, 760, 361/726; 174/138 E, 138 G
See application file for complete search history.

(56) References Cited

U.S. PATENT DOCUMENTS

| | | | | |
|---|---|---|---|---|
| 5,250,751 A * | 10/1993 | Yamaguchi | .................... | 174/354 |
| 5,954,537 A * | 9/1999 | Sonobe et al. | ................ | 439/495 |
| 6,894,582 B2 * | 5/2005 | Whybrew et al. | ............... | 333/33 |
| 7,876,579 B1 * | 1/2011 | Tsau | ............................ | 361/818 |
| 7,969,748 B2 * | 6/2011 | Niederkorn et al. | .......... | 361/816 |
| 8,081,438 B2 * | 12/2011 | Karashima et al. | ...... | 361/679.27 |
| 8,192,209 B1 | 6/2012 | Li et al. | | |
| 8,337,220 B2 | 12/2012 | Powell | | |
| 2012/0176277 A1 | 7/2012 | Malek et al. | | |
| 2012/0176755 A1 | 7/2012 | Malek et al. | | |

* cited by examiner

*Primary Examiner* — Hung S Bui

(57) ABSTRACT

Retention structures are provided to guide and secure a co-axial cable from an upper portion to a lower portion of a logic board having a bend region. In one embodiment, a retention structure can guide, retain, and electrically ground the co-axial cable at multiple locations. In another embodiment, a retention structure can provide route a co-axial cable around the bend region of the logic board, while providing strain relief and the ability to accommodate co-axial cables of different lengths, due to manufacturing tolerances. Multi-purpose cowling structures are also provided to minimize spacing impact within an electronic device, while maximizing functional utility. In another embodiment, a cowling can electrically connect the ground plane of a logic board to the ground plane of a housing member and provide a pre-load force to a conductor connection existing on logic board.

22 Claims, 16 Drawing Sheets

ELECTRONIC DEVICES HAVING MULTI-PURPOSE COWLINGS AND CO-AXIAL CABLE GROUNDING AND FIXTURE BRACKETS

BACKGROUND

The connection of a co-axial cable to one or more locations within an electronic device such as on a printed circuit board ("PCB") should be done in a way that is rapid and efficient and produces strong and reliable electrical and mechanical connection of that cable. Especially for products where cable connections can be subject to "use" stress and "manufacturing" stress where sufficient grounding connections are needed to reduce interference with other components in the device, it is desirable to have connections that do not fail under the stress to provide adequate grounding for the cable. Improvements in cable retention and grounding technology are therefore always being sought.

SUMMARY

Retention structures are provided to guide and secure a co-axial cable from an upper portion to a lower portion of a logic board having a bend region. In one embodiment, a retention structure can guide, retain, and electrically ground the co-axial cable at multiple locations. In another embodiment, a retention structure can route a co-axial cable around the bend region of the logic board, while providing strain relief and the ability to accommodate co-axial cables of different lengths, due to manufacturing tolerances. Multi-purpose cowling structures are also provided to minimize spacing impact within an electronic device, while maximizing functional utility. In another embodiment, a cowling can electrically connect the ground plane of a logic board to the ground plane of a housing member and provide a pre-load force to a conductor connection existing on logic board.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can be provided with mechanical and electrical components for providing different functionalities to a user. In some cases, components of an electronic device can be constructed to provide mechanical features that improve the performance, aesthetics, robustness and size of the electronic device.

Electronic devices that may be provided with these components can include desktop computers, computer monitors, computer monitors containing embedded computers, wireless computer cards, wireless adapters, televisions, set-top boxes, gaming consoles, routers, portable electronic devices such as laptop computers, tablet computers, and handheld devices such as cellular telephones and media players, and small devices such as wrist-watch devices, pendant devices, headphone and earpiece devices, and other wearable and miniature devices. Portable devices such as cellular telephones, media players, and other handheld electronic devices are sometimes described herein as an example.

Figure 1:
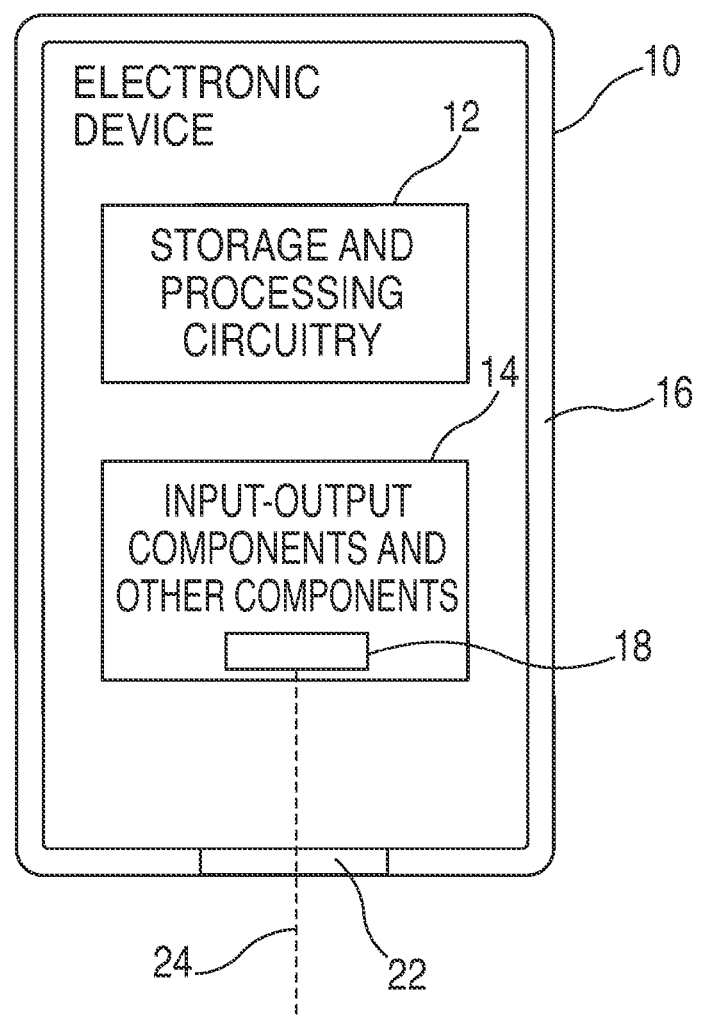
FIG. 1 is a schematic view of an illustrative electronic device that can be provided with mechanical and electrical features in accordance with one embodiment of the invention.

FIG. 1 shows an illustrative electronic device 10 according to an embodiment of the invention. As shown in FIG. 1, device 10 can include storage and processing circuitry 12. Storage and processing circuitry 12 can include one or more different types of storage such as hard disk drive storage, nonvolatile memory (e.g., flash memory or other electrically-programmable-read-only memory), volatile memory (e.g., static or dynamic random-access-memory), or combinations of these. Storage and processing circuitry 12 may be used in controlling the operation of device 10. Processing circuitry in circuitry 12 can be based on processors such as microprocessors, microcontrollers, digital signal processors, dedicated processing circuits, power management circuits, audio and video chips, and other suitable integrated circuits.

Storage and processing circuitry 12 can be used to run software on device 10, such as internet browsing applications, voice-over-internet-protocol (VOIP) telephone call applications, email applications, media playback applications, operating system functions, antenna and wireless circuit control functions, or combinations of these. Storage and processing circuitry 12 can be used in implementing suitable communications protocols. Communications protocols that may be implemented using storage and processing circuitry 12 can include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, or other such communications protocols.

Input-output devices 14 may be used to allow data to be supplied to device 10 and to allow data to be provided from device 10 to external devices. Examples of input-output devices 14 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, or combinations of these. A user can control the operation of device 10 by supplying commands through devices 14 or by supplying commands to device 10 through an accessory that communicates with device 10 through a wireless or wired communications link. Devices 14 or accessories that are in communication with device 10 through a wired or wireless connection may be used to convey visual or audio information to the user of device 10. Device 10 may include connectors for forming data ports (e.g., for attaching external equipment such as computers, accessories, etc.).

Various components of electronic device 10 may be contained in housing 16. Housing 16 can protect the internal components and may help keep the internal components in their assembled positions within device 10. Housing 16 may also provide aesthetics for device 10 (e.g., an ornamental appearance). The shape and construction of housing 16 can vary widely to accommodate different device 10 configurations. For example, housing 16 can be a multi-piece assembly of different parts that interconnect together to hold electronics and/or components (e.g., glass) in place. The parts may be constructed from the same or different materials. A more detailed example of multi-part assembly for housing 16 is discussed below in connection with FIG. 2. As another example, a portion of housing 16 can include a translucent/transparent portion through which internal components may optically communicate to the outside world.

Device 10 can include one or more optical systems 18. Each optical system 18 can include, for example, optical components that transmit and/or receive visual and/or non-visual spectrums of light through window or opening 22 in the housing 16. The optical components can, for example, correspond to one or more camera modules, proximity sensors, or ambient light sensors. For example, a camera module, which is situated inside housing 16, may be configured to capture image data outside the device 10 via window 22 by a line of sight that passes through window 22. Device 10 can include one or more alignment structures for ensuring proper mounting and operation of optical system 18.

Figure 2A:
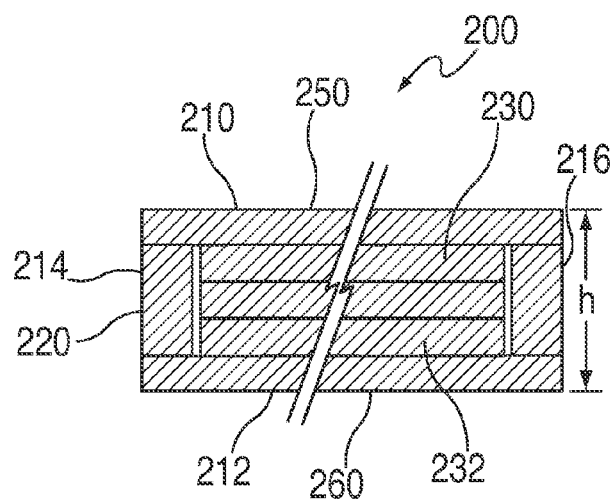
FIG. 2A is a cross-sectional view of an illustrative electronic device structure taken along the device width in accordance with one embodiment of the invention.
Figure 2B:
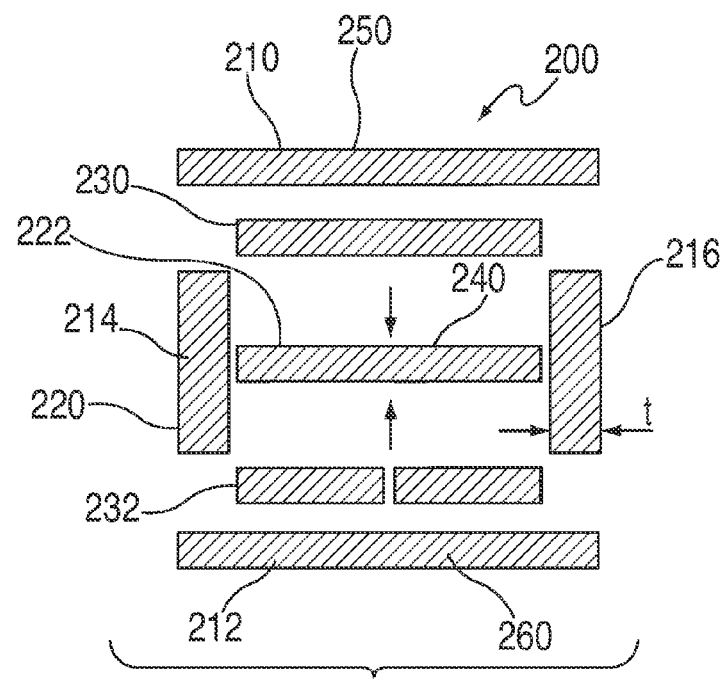
FIG. 2B is an exploded cross-sectional view of an illustrative electronic device taken along the device length in accordance with one embodiment of the invention.
Figure 2C:
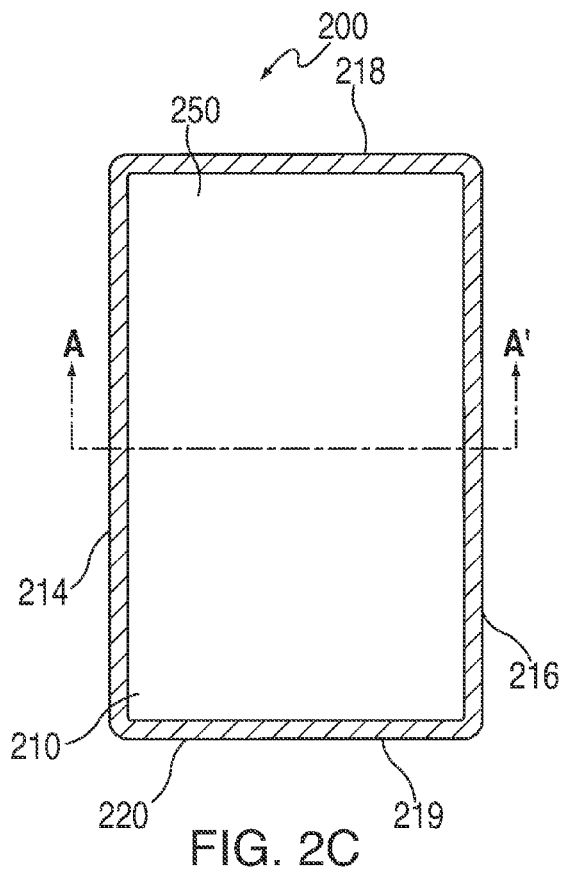
FIG. 2C is a top view of an illustrative electronic device in accordance with one embodiment of the invention.
Figure 2D:
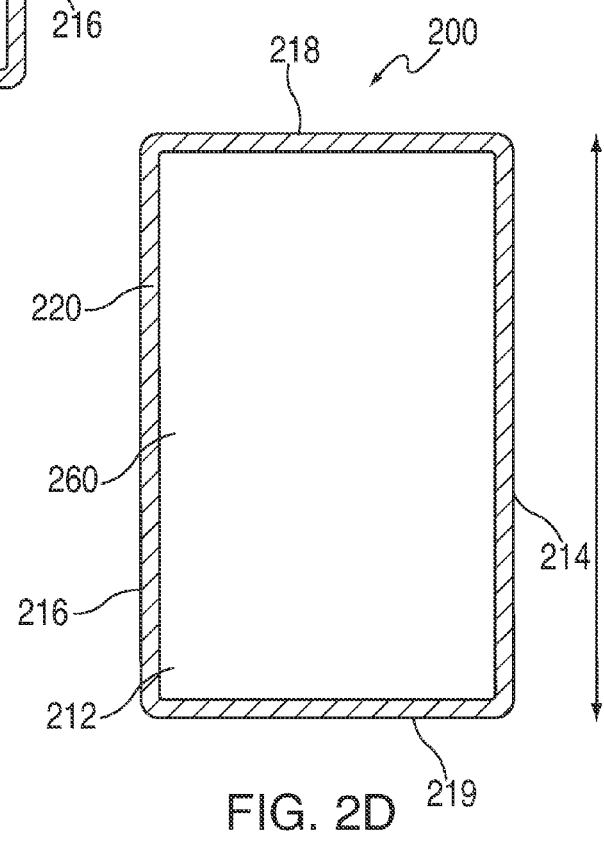
FIG. 2D is a bottom view of an illustrative electronic device in accordance with one embodiment of the invention.

A housing member of an electronic device (e.g., housing 16 of electronic device 10 of FIG. 1) can provide a variety of attributes to the electronic device including, for example, structural attributes, functional attributes, cosmetic attributes, or combinations thereof. In some cases, a housing member can form an external component of the electronic device, and therefore provide the mechanical structure for the device. A housing member can be provided in any suitable form. In some embodiments, the housing member can include an outer periphery member. FIG. 2A is a cross-sectional view of an illustrative electronic device structure having an outer periphery member taken along the device width in accordance with one embodiment of the invention. FIG. 2B is an exploded cross-sectional view of an illustrative electronic device having an outer periphery member taken along the device length in accordance with one embodiment of the invention. FIG. 2C is a top view of an illustrative electronic device having an outer periphery member in accordance with one embodiment of the invention. FIG. 2D is a bottom view of an illustrative electronic device having an outer periphery member in accordance with one embodiment of the invention. Electronic device 200 can include any suitable type of electronic device including, for example, one or more of the types of electronic devices described above in connection with device 10 (FIG. 1).

Electronic device 200 can have any suitable shape including, for example, a shape delimited by front surface 210, back surface 212, left surface 214, right surface 216, top surface 218 (not shown in the cross-sections of FIGS. 2A and 2B) and bottom surface 219 (not shown in the cross-sections of FIGS. 2A and 2B). Each surface can be substantially planar, curved, or combinations of these. The surfaces can include one or more chamfers, detents, openings, dips, extensions, or other features modifying the smoothness of the surfaces.

Electronic device 200 can be constructed using any suitable structure, including for example using outer periphery member 220. Outer periphery member 220 can form a loop that surrounds or wraps around some or all of the electronic device. The loop formed by outer periphery member 220 can define internal volume 222 into which electronic device components can be placed. For example, outer periphery member 220 can wrap around the device such that the external surfaces of outer periphery member 220 define some or all of left surface 214, right surface 216, top surface 218 and bottom surface 219 of the device. To provide a desired functionality to a user, the electronic device can include several components placed within the device such as, for example, within volume 222.

Outer periphery member 220 can have a particular height (e.g., the device height h) that serves to define an amount of volume 222. In particular, volume 222, or individual measurable quantities of outer periphery member 220 (e.g., height, thickness, length, or width) can be selected to provide at least a minimum volume amount required for receiving and securing electronic device components. In some embodiments, other criteria can instead or in addition drive the measurable quantities of outer periphery member 220. For example, the thickness (e.g., outer periphery member thickness t as shown in FIG. 2B), length (e.g., device length l as shown in FIG. 2A), height (e.g., device height h as shown in FIG. 2D), and cross-section of the outer periphery member can be selected based on structural requirements (e.g., stiffness, or resistance to bending, compression, tension or torsion in particular orientations). As another example, the measurable quantities of outer periphery member 220 can be selected based on a desired device size or shape, which may be driven by industrial design considerations.

In some embodiments, outer periphery member 220 can serve as a structural member to which other electronic device components can be mounted. In particular, it may be desirable to secure individual electronic device components placed within device 200 to ensure that the components do not move and break, which could adversely affect the functionality of the device. Outer periphery member 220 can include any suitable feature for securing a device component. For example, outer periphery member 220 can include one or more depressions, recesses, channels, protrusions, or openings for receiving or engaging electronic device components. In some embodiments, outer periphery member 220 can instead or in addition include features for retaining internal structural device components to which other components can be secured. For example, an internal structure such as an internal platform (described below in more detail) can be coupled to an internal surface of outer periphery member 220, such that other electrical components can be mounted to the internal platform. In some embodiments, outer periphery member 220 can include one or more openings to provide access to one or more internal components retained within volume 222.

Outer periphery member 220 (or device 200) can have any suitable cross-section. For example, outer periphery member 220 can have a substantially rectangular cross-section. In some embodiments, outer periphery member 220 can instead or in addition have a cross-section in a different shape including, for example, a circular, oval, polygonal, or curved cross-section. In some embodiments, the shape or size of the cross-section can vary along the length or width of the device (e.g., an hourglass shaped cross-section).

Outer periphery member 220 can be constructed using any suitable approach. In some embodiments, outer periphery member 220 can be constructed by connecting several distinct elements together. For example, outer periphery member 220 can be constructed by connecting three distinct elements together.

The elements can be formed from any suitable material including, for example, a metal. The individual elements can also be formed using any suitable approach. For example, an element can be formed using cold work. As another example, an element can instead or in addition be formed using a forging process, an annealing process, a machining process, or any other suitable process or combination of processes. In some embodiments, the elements can be included in one or more electrical circuits (e.g., as part of an antenna assembly, or as a heart-rate monitor).

Any suitable approach may be used to connect the individual elements of outer periphery member 220. In some embodiments, a fastener or adhesive can be used to connect the individual elements. In other embodiments, individual elements can be connected to each other or to other electronic device components using a braising process (e.g., connecting a ceramic material to an individual component serving as part of an antenna). In further embodiments, intermediate elements can instead or in addition be placed between adjacent individual elements to securely connect the individual elements together. For example, an intermediate element can be formed from a material (e.g., a plastic material) that can change from a first state to a second state. In the first state, the material of the intermediate element can flow in a gap between adjacent individual elements. In the second state, the material can adhere to the adjacent individual elements, and provide a structural bond between the individual elements such that the individual elements and the intermediate element form an integral component.

In some embodiments, the individual elements can be formed from a conductive material, while the intermediate elements can be formed from an insulating or dielectric material. This can ensure that different electrical circuits that include individual elements do not interfere with one another. In addition, the dielectric material in gaps between individual elements can help control capacitance, radio frequency energy, and other electrical transfers across the gaps.

Connecting individual elements together using an intermediate element can create artifacts or other imperfections along the interfaces between the individual elements and the intermediate element. For example, excess material of the intermediate element can flash or spill beyond a boundary of the interface, and onto an external surface of one of the individual elements. To ensure that the resulting component is aesthetically pleasing and satisfies industrial design requirements, the component can be processed to remove excess material from one or more of the individual elements and the intermediate element. For example, a single process or tool can be used to finish the different elements. The single process can be applied at a single setting including, for example, a setting corresponding to the softest material of the individual elements and the intermediate element used to form a component.

In some cases, the process can instead or in addition dynamically adjust the manner in which the process is applied based on the material or element being processed. For example, the force, speed or tool type used can vary based on the element being processed. The resulting component can include a continuous surface across an interface between an individual element and an intermediate element. For example, the resulting component can include a smooth surface across a seam between two elements.

Electronic device components can be placed within volume 222 using any suitable approach. For example, electronic device 200 can include components 230 and 232 inserted into volume 222. Each of components 230 and 232 can include individual components, or several components assembled together as a component layer or stack, or include several distinct layers of components to insert within volume 222. In some embodiments, components 230 and 232 can each represent several components stacked along the height of the device. The component layers can be electrically coupled to each other to enable data and power transfers, as required for the proper operation of electronic device 200. For example, the component layers can be electrically coupled using one or more of a PCB, flex, solder, SMT, wires, connectors, or combinations of these. The component layers can be inserted into outer periphery member 220 using any suitable approach. For example, components 230 and 232 can all be inserted from front surface 210 or from back surface 212 (e.g., back to front, front to back, or middle to front and back). Alternatively, the components can be inserted from both front surface 210 and back surface 212.

In some embodiments, one or more of the components can serve as a structural element. Alternatively, electronic device 200 can include a distinct structural element placed within volume 222 and coupled to outer periphery member 220. For example, electronic device 200 can include one or more internal members or platforms 240, which can serve as a mounting points or regions for helping to secure, hold or pack one or more component layers (e.g., attaching component 230 to the back surface of internal platform 240, and component 232 to the front surface of internal platform 240). Internal platform 240 can be coupled to outer periphery member 220 using any suitable approach including, for example, using snaps, fasteners, flexures, welds, glue, or combinations of these. Alternatively, internal platform 240 may even be part of outer periphery member 220 (e.g., machined, extruded, or cast, or integrally formed as a single unit). Internal platform 240 can have any suitable size including, for example, a size that is smaller than the internal volume of outer periphery member 220.

Internal platform 240 can be positioned at any suitable height within outer periphery member 220 including, for example, substantially at half the height of outer periphery member 220. The resulting structure (e.g., outer periphery member 220 and internal platform 240) can form an H-shaped structure that provides sufficient stiffness and resistance to tension, compression, torsion and bending.

Internal platform 240, inner surfaces of outer periphery members 220, or both can include one or more protrusions, depressions, shelves, recesses, channels, or other features for receiving or retaining electronic device components. In some cases, internal platform 240, outer periphery member 220 or both can include one or more openings for coupling components located in the front and back regions of internal platform 240. The size of each region can be selected based on any suitable criteria including, for example, operational needs of system, numbers and types of electrical components in device 200, manufacturing constraints of internal platform 240, or combinations of these. Internal platform 240 can be constructed as a distinct component from any suitable material (e.g., plastic, metal or both), or instead defined from an existing electronic device component placed within volume 222 defined by outer periphery member 220. For example, internal platform 240 can be formed by a printed circuit board or chip used by the device.

In some embodiments, internal platform 240 can include one or more electrically conductive elements for providing electrical connections between the components. For example, internal platform 240 can include one or more PCB, flex, wire, solder pad, cable, connector, or other electrically conductive mechanism for connecting components within the device.

Electronic device 200 can include front cover assembly 250 and back cover assembly 260 defining the front and back surfaces, respectively, of device 200. The front and back cover assemblies 250 and 260 can include one or more components, or can include at least a front member and a back member that form some or all of the outer front and back surfaces of the device. Front and back cover assemblies 250 and 260 can be flush, recessed or protruding relative to the front and back surfaces of outer periphery member 220. In the example of FIGS. 2A and 2B, front cover assembly 250 and back cover assembly 260 can be proud or protrude above front and back edges of outer periphery member 220 (e.g., such than an interior surface of cover assemblies 250 and 260 is flush with a front or back surface of outer periphery member 220).

Alternatively, one or both of cover assemblies 250 and 260 can be flush or sub-flush relative to outer periphery member 220 in order, for example, to prevent the edges from engaging other surfaces (e.g., at least a portion of cover assemblies 250 and 260 can be included within volume 222). In some embodiments, one or both of front cover assembly 250 and back cover assembly 260 can include one or more windows. Any suitable information or content can pass through the windows. For example, a cover assembly can include a window through which a camera can capture images.

In some embodiments, different components of electronic device 200 can be substantially made of glass. For example, portions of the electronic device housing can have at least 75% of its exterior as glass. In one implementation, one or both of cover assemblies 250 and 260 can include a glass element providing a substantial portion of the cover assembly. In particular, front and back surfaces 210 and 212 of the device can include substantial amounts of glass, while left, right, top and bottom surfaces 214, 216, 218, and 219 of the device can include substantial amounts of a metal (e.g., steel).

In some embodiments, the housing of portable electronic device 200 can be banged or rubbed against various surfaces. When plastic or softer metal housing surfaces are used, the surfaces tend to become scratched. On the other hand, glass housing surfaces (e.g., glass cover assemblies) can be more scratch resistant. Moreover, glass housing surfaces can offer radio transparency, while metal housing surfaces can disturb or hinder radio communications. In one embodiment, an electronic device housing can use glass housing members (e.g., glass cover assemblies) for front surface 210 and back surface 212 of the electronic device housing. For example, front surface 210 formed from a glass housing member can be transparent to provide visual access to a display device positioned behind the glass housing member at the front surface, while back surface 212 formed from a glass housing member can be transparent or non-transparent. Non-transparency, if desired, can conceal any interior components within the electronic device housing. In one embodiment, a surface coating or film can be applied to the glass housing member to provide non-transparency or at least partial translucency. Such a surface coating or film can be provided on an inner surface or an outer surface of the glass housing member.

Figure 3:
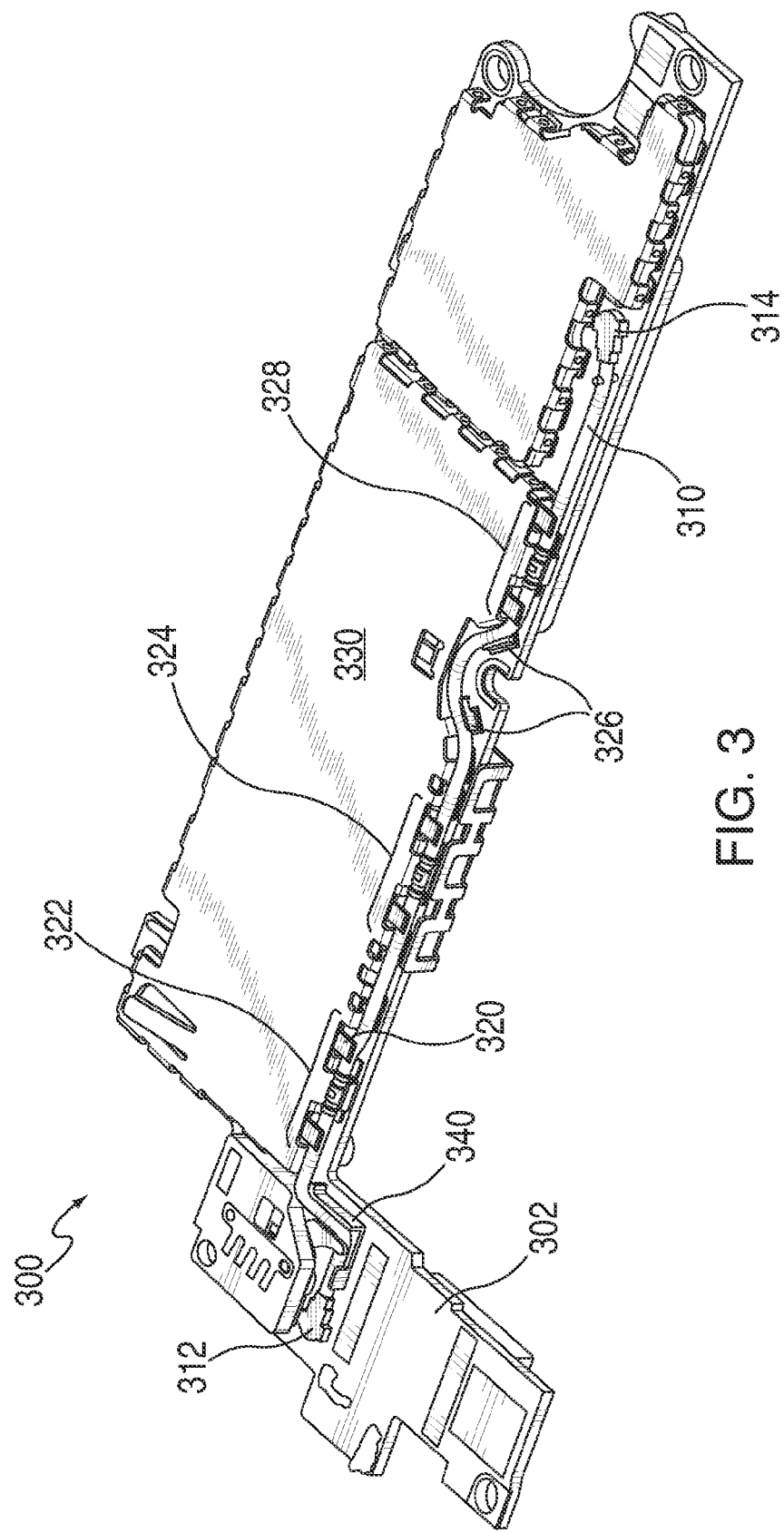
FIG. 3 shows an illustrative perspective view of a board assembly in accordance with an embodiment of the invention.
Figure 4:
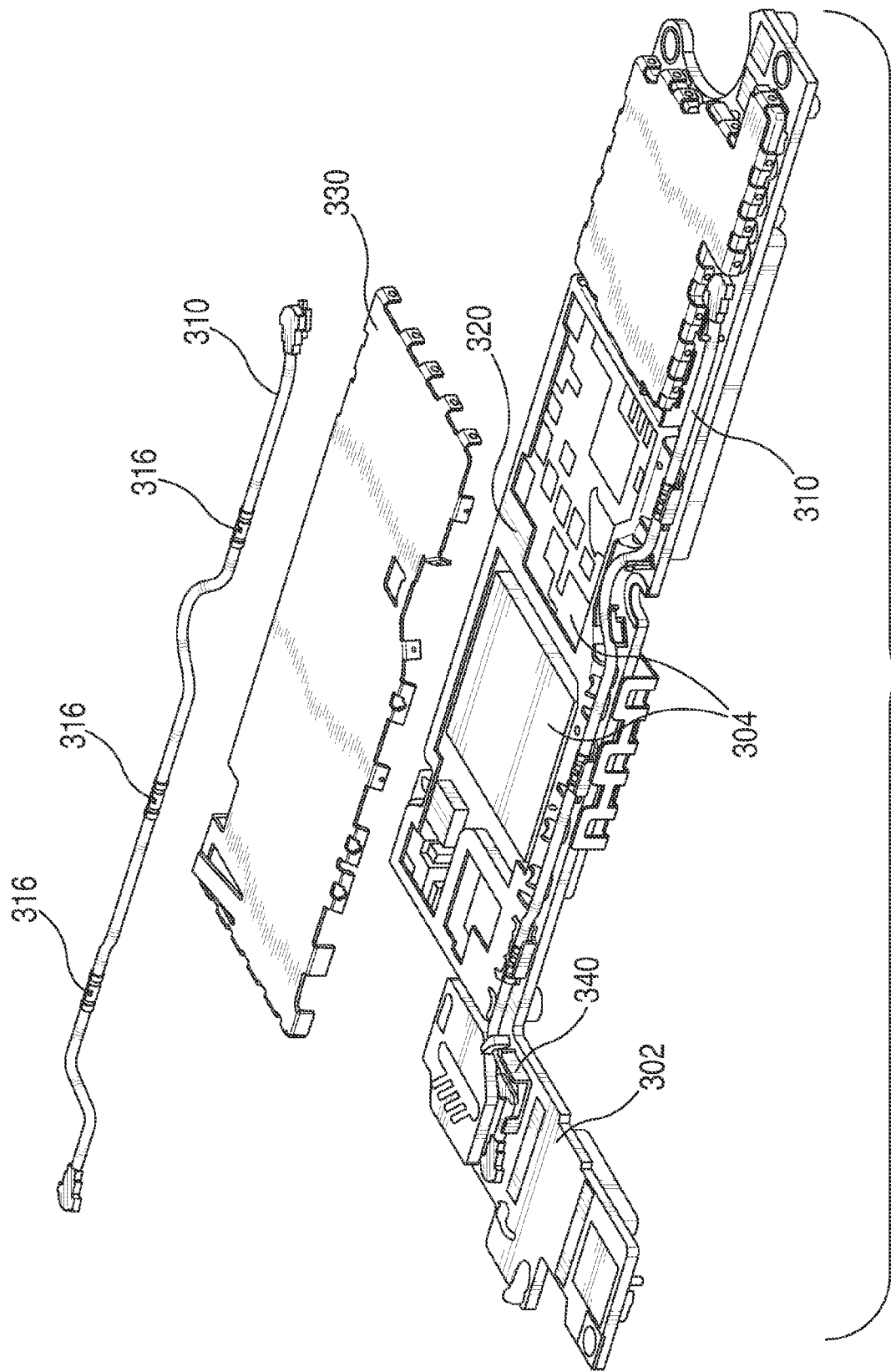
FIG. 4 shows a partially exploded view of a board assembly in accordance with an embodiment of the invention.
Figure 5A:
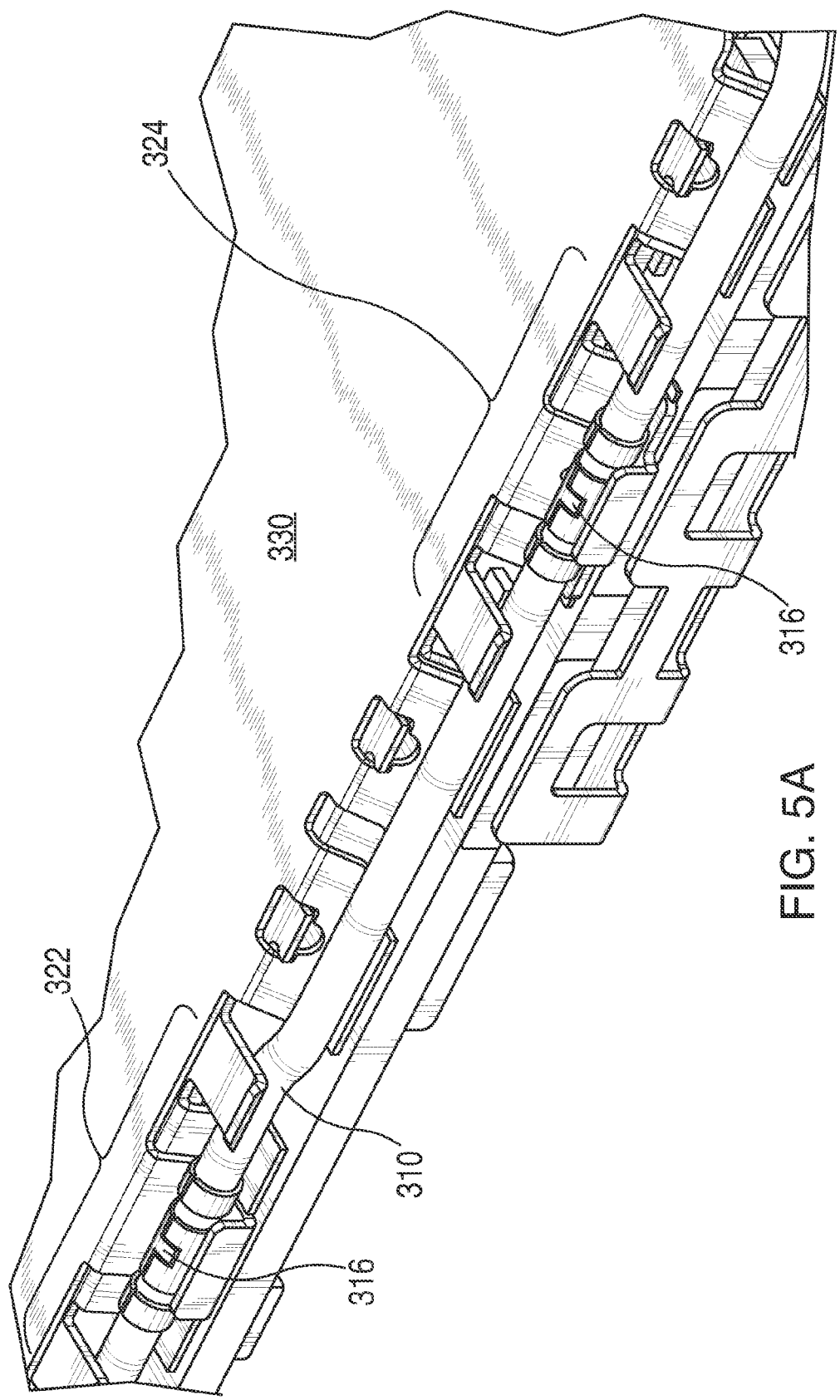
FIGS. 5A-C and 6 show magnified views of various retention regions in accordance with various embodiments according to the invention.
Figure 5B:
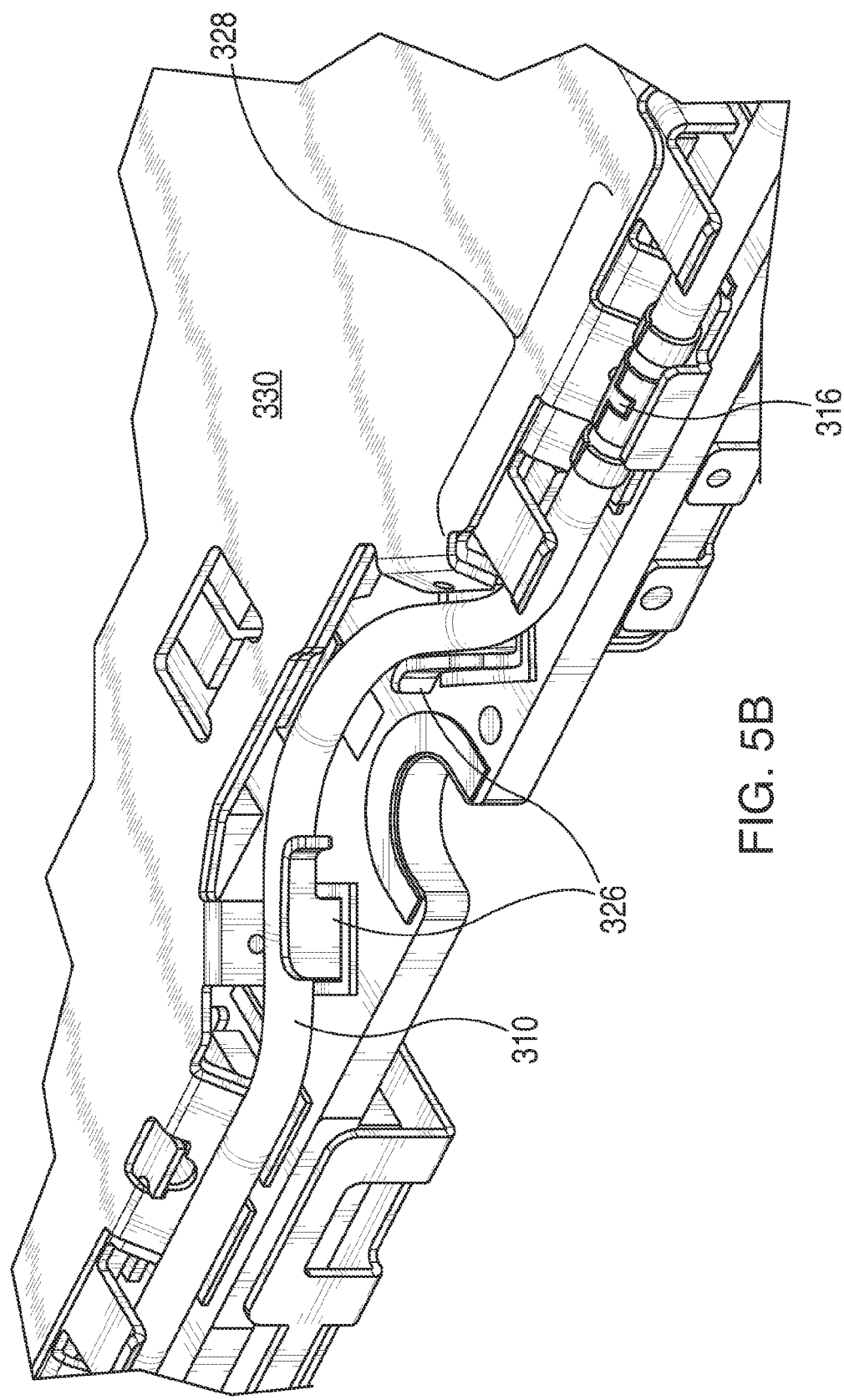
Figure 5C:
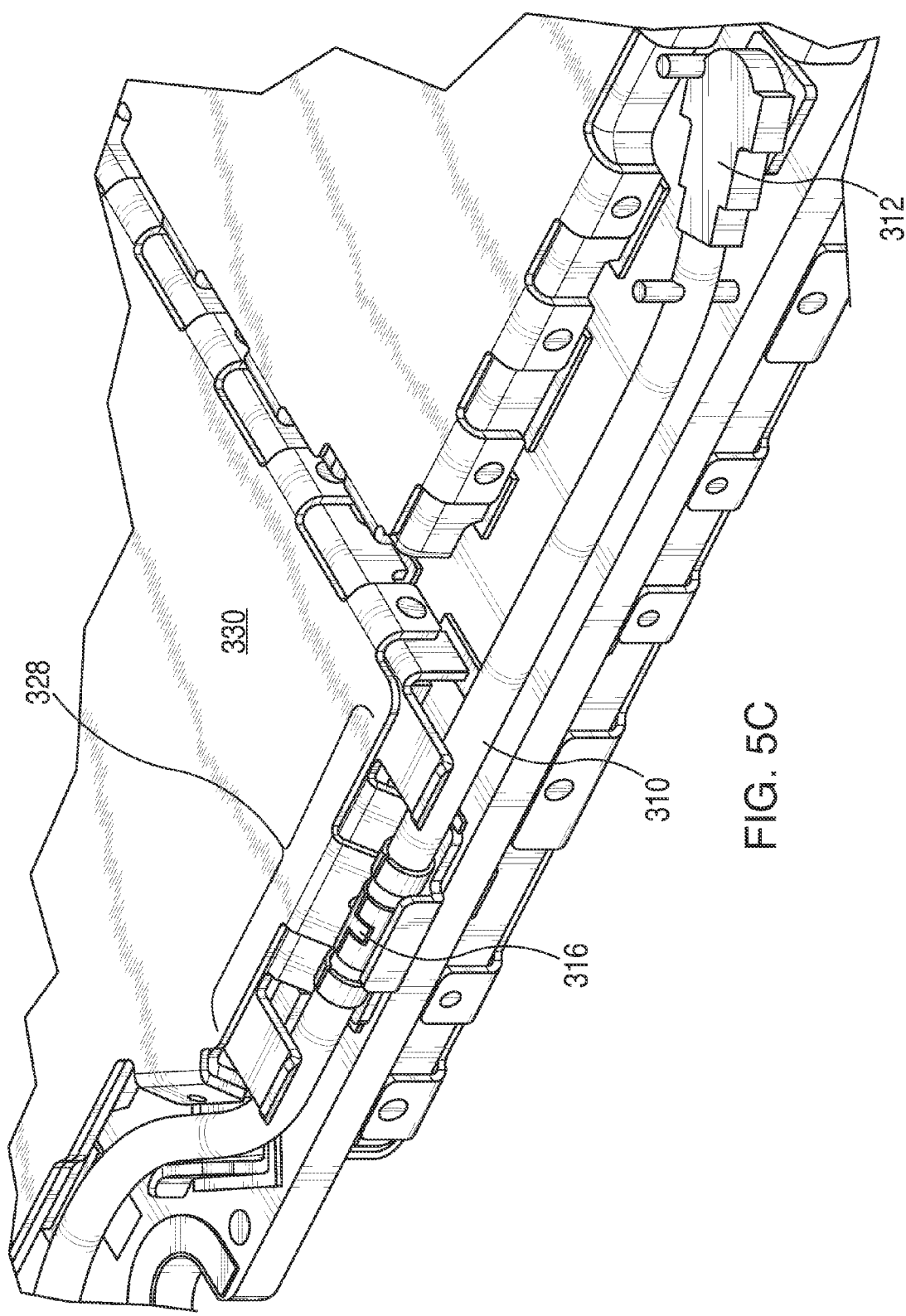

FIG. 3 shows an illustrative perspective view of board assembly 300 and FIG. 4 shows a partially exploded view of board assembly 300 in accordance with embodiments of the invention. Board assembly 300 includes logic board 302, which has several attached components including co-axial cable 310, EMI shield fence 320, EMI shield 330, and bracket 340. Logic board 302 is shown to exhibit an L-shape, but it is understood that any suitable board shape may be used. The L-shape does provide a relatively lengthy expanse that is traversed by co-ax cable 310.

Co-axial cable 310 can include any suitable cable for transmitting power and/or data from one location to another. Cable 310 is attached to board 300 at surface mount connection 312 (located near the top of board 302) and at surface mount connection 314 (located near the bottom of board 302). The surface mount connection may be a solder connection. Cable 310 may have barrels 316 placed at various locations along the length of the cable. Barrels 316 are electrically coupled to the grounding wire (typically the outer most conductive sheath) of co-axial cable 310 and provide a means to physically ground cable 310 at each barrel location.

Cable 310 is routed from connection 312 through bracket 340 along a top surface near an edge of board 302 to connection 314. The portion of cable 310 routed along the edge of board 302 is guided by, retained, and grounded by EMI shield fence 320 at one or more locations such as retention regions 322, 324, 326, and 328. Retention regions 322, 324, 326, and 328 are shown in more detail in FIGS. 5A-C, and a magnified view of retention region 328 is shown FIG. 6. Referring collectively to FIGS. 3-6, cable 310, EMI shield fence 320, and EMI shield 330 are discussed.

EMI shield fence 320 and EMI shield 330 are mounted around and on top of circuitry 304 mounted on logic board 302. During assembly, shield fence 320 is first mounted to board 302 and shield 330 is mounted on top of shield fence 320. Shield fence 320 and shield 330 can shield circuitry 304 from electromagnetic interference emanating from other sources with a device containing assembly 300 and/or can prevent or at least limit any electromagnetic interference being generated by circuitry 304 from affecting other circuitry or components contained in the device. Shield fence 320 can provide "horizontal" EMI protection as it provides shielding in a plane parallel to the plane of logic board 302. Shield 330 can provide "vertical" EMI protection as it provides shielding in space perpendicular to the plane of logic board 302.

Figure 6:
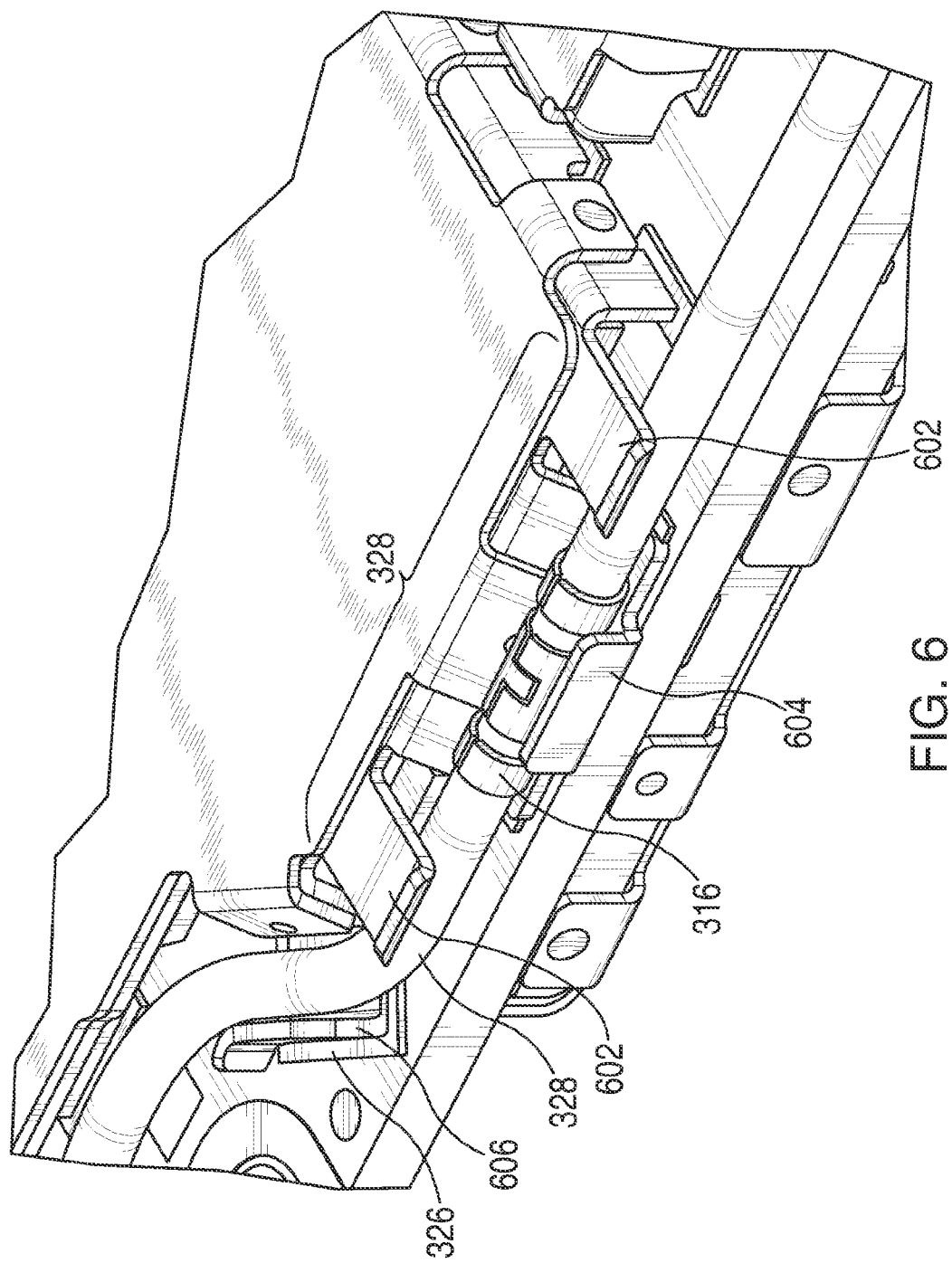

Shield fence 320 can include retention regions 322, 324, 326, and 328 that extend away from an edge of shield fence 320 towards the edge of board 302. Only four such retention regions are shown, but it is understood that any number of retention regions may be included. Retention regions can include a bottom hook, an overhang, or a combination of both a bottom hook and overhang. Referring specifically to FIG. 6, retention region 328 includes overhangs 602 and bottom hook 604. Overhangs 602 apply downward pressure on cable 310, whereas bottom hook 604 assists in retention of cable 310. Because overhangs 602 are spaced on opposite ends of bottom hook 604, this forces cable 310 to be interleaved therebetween during assembly, thereby providing a stable and relatively secure connection that will endure during use of a device using assembly 300. Retention region 326 is an example of a retention region having bottom hook 606 that provides cable guidance and at least partial retention. As shown, regions 326 can guide cable 310 around a partial loop.

Shield fence 320 and shield 330 may be electrically grounded to other ground sources (not shown) in the device, or shield fence 320 and shield 330 may independently serve as a ground source. Shield fence 320 can electrically ground different locations of ground cable 310 with its retention regions such as regions 322, 324, 326 and 328. That is, each of the overhangs and bottom hooks may be electrically grounded and to the extent any of the overhangs and bottom hooks couple to barrels 316, cable 310 may be grounded at those couplings. For example, as shown in FIG. 6, bottom hook 604 is in electrical contact with barrel 316 and thus cable 310 is grounded at that location.

Figure 7:
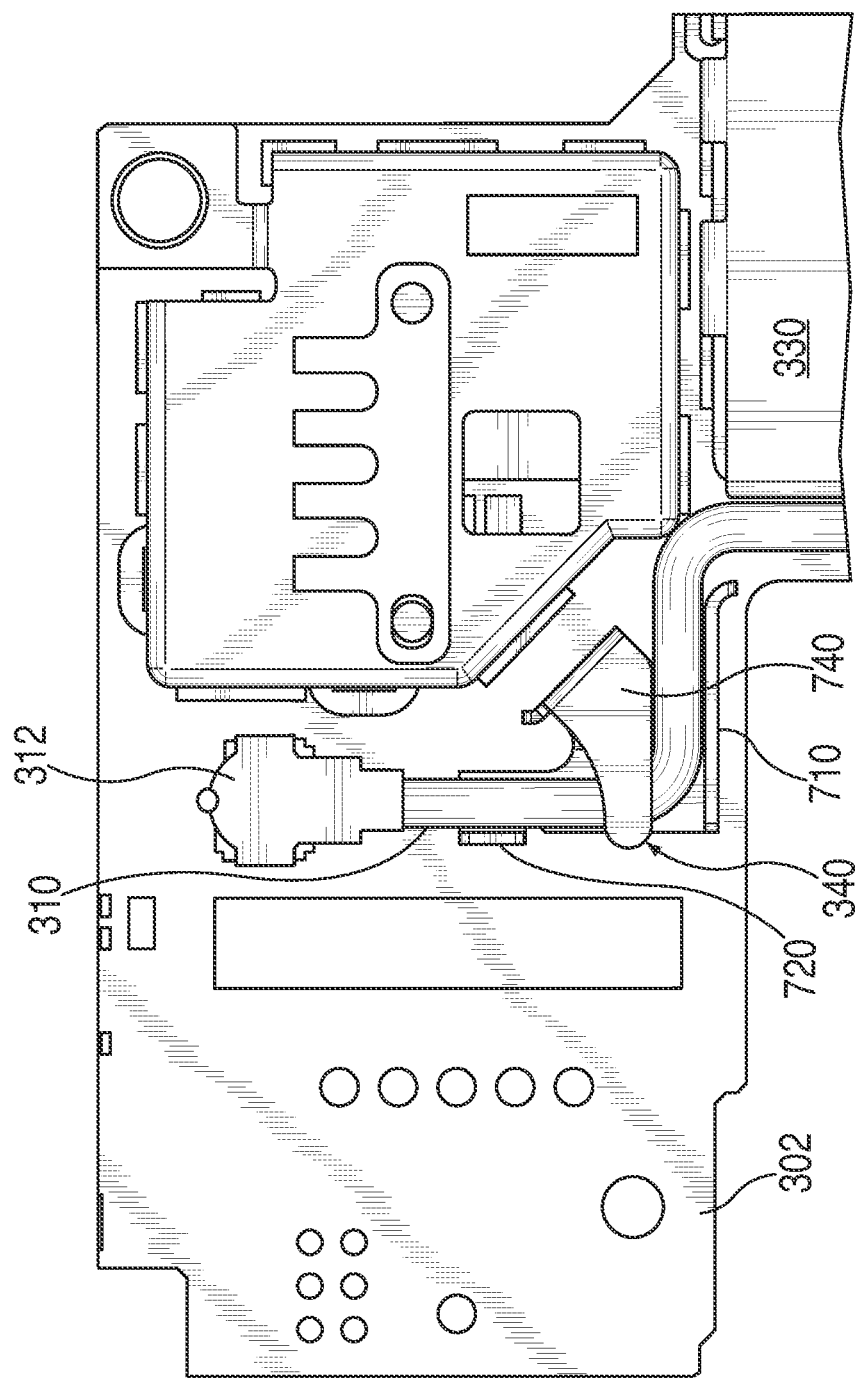
FIG. 7 show an illustrative partial view of a board assembly having a bracket in accordance with embodiment of the invention.

Referring now to FIG. 7, bracket 340 is discussed in more detail. As shown, bracket 340 is mounted near an L-shaped region of board 302. That is, board 302 may have a 90 degree bend in its shape, and as a result, cable 310 has to be secured in place so it can be routed around this bend. It is understood that although an L-shaped region is shown in FIG. 7, any board configuration that requires cable 310 to be bent at an angle of 45 degrees or more during construction may exist. In some embodiments, bracket 340 may be soldered to board 302.

Bracket 340 may function as a retaining member and a strain gauge for cable 310. For example, bracket 340 may function as a retaining member by holding cable 310 in place. In addition, bracket 340 may function as a strain gauge by bearing stress caused by bending of cable 310. The strain gauge function helps reduce the load applied to connection 312.

In addition to the retaining and strain functions, bracket 340 is constructed to accommodate for manufacturing tolerance differences of cable 310, which can result in cables of varying length. Since it is undesirable for cable 310 to bunch up near connection 312, bracket 340 can "accommodate" the slack if cable 310 is on the longer side of its manufacturing tolerance, yet is able to retain cable 310 and provide strain relief if the cable is on the shorter side of its manufacturing tolerance. Bracket 340 can be constructed from any suitable material such as, for example, a metal or plastic.

Figure 8:
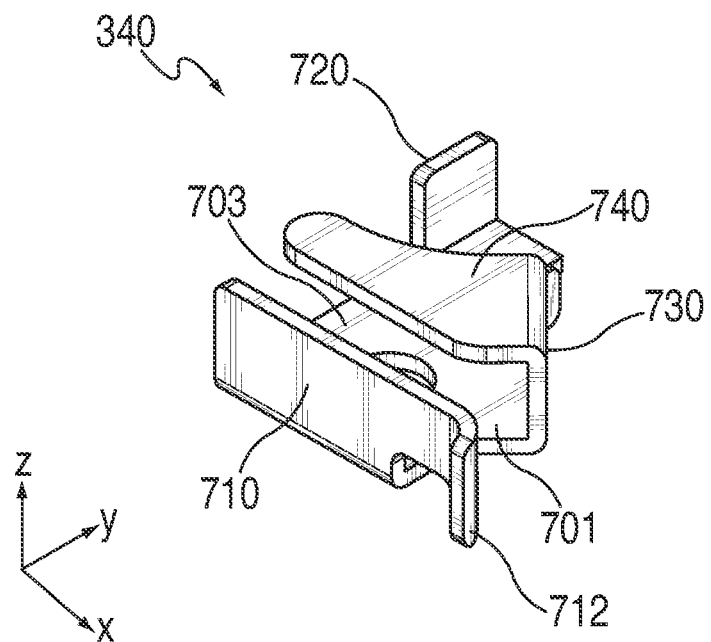
FIGS. 8 and 9A-F illustrate various views of a bracket in accordance with an embodiment of the invention.
Figure 9A:
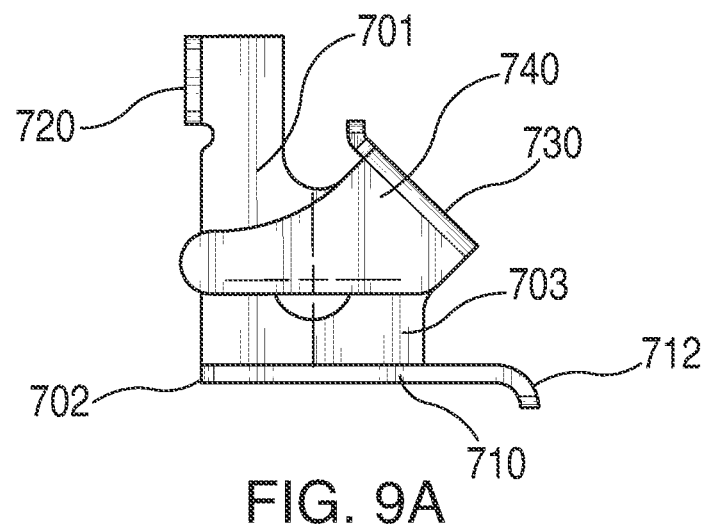
Figure 9B:
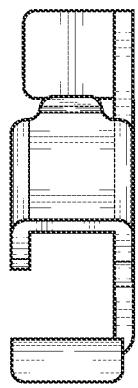
Figure 9C:
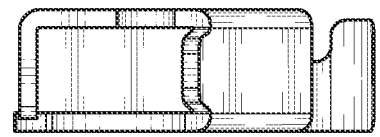
Figure 9D:
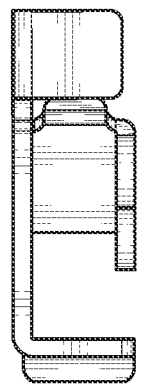
Figure 9E:
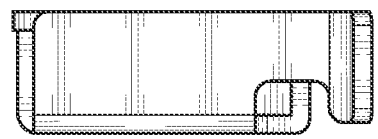
Figure 9F:
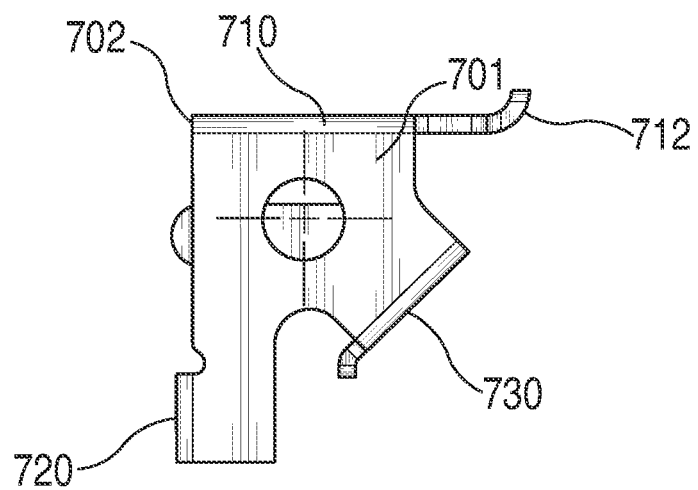

Referring now to FIGS. 8 and 9A-F, an isometric view of bracket 340 according to an embodiment of the invention is shown in FIG. 8 and respective top view, right side view, top side view, left side view, bottom side view, and bottom view are shown in FIGS. 9A, 9B, 9C, 9D, 9E, and 9F, respectively. Bracket 340 includes floorplate 701 having a corner 702. Bracket 340 includes x-axis member 710, y-axis member 720, angled member 730, and retention member 740. Cable accommodation area 703 exist within members 710, 720, and 730 and is the area in which a cable is routed. A long cable may follow member 710, turn at corner 702 and follow member 720. A short cable may follow member 730. Cables having a length that falls between that of long and short cables may follow any path through area 703.

X-axis member 710 can extend along the entire x-axis portion of floorplate 701 and have a predetermined height extending in the z-axis direction. As shown, member 710 can extend beyond the periphery of floorplate 701 and have curved portion 712.

Y-axis member 720 can extend along a portion of y-axis portion of floorplate 701 and have a predetermined height extending in the z-axis direction. As shown, member 720 exists at a distal end of the y-axis portion of floorplate 701, thereby leaving a window adjacent to member 720. In one embodiment, the heights of members 710 and 720 can be the same. In another embodiment, the heights of members 710 and 720 can be different.

Angled member 730 can extend along angled portion of floorplate 701 and have a predetermined height extending in the z-axis direction. The predetermined height of member 730 can be same as or different (e.g., either greater or less) than the heights of members 710 and 720.

Retention member 740 stems from the top of angled member 730 and spans across a portion of area 703. Retention member 740 may apply a downward force to the cable when it is routed through bracket 340. During assembly, the cable can be looped around retention member 740 through the window existing on the y-axis and then pulled through. The length of the cable will dictate which path through area 703 it will take.

As electronic devices are assembled, various physical and electrical connections are necessary to ensure proper operation of the device. Some of these connections can be grounding connections that provide an electrical pathway between one component (e.g., a logic board) and another component (e.g., chassis ground plane). Other connections may secure a logic board to a device housing (e.g., internal platform 240 of FIG. 2B). Yet other connections can secure a co-axial cable, flex circuit, or other signal and/or power conducting medium to a predetermined location within the device.

The physical coupling of these connections can be attained by solder connections, threaded screw connections, heat weld connections, pressure connections (i.e., where force such as a spring force makes the connection), or any other suitable connection. Some of these connections provide stronger, more secure, physical connections than others. For example, a threaded screw connection may be a more secure connection than a solder connection. The stronger, more secure connections (e.g., threaded connections) are generally more desirable. However, inclusion of such connections typically command higher space premiums and more limited placement options than their less robust connection counterparts.

Figure 10A:
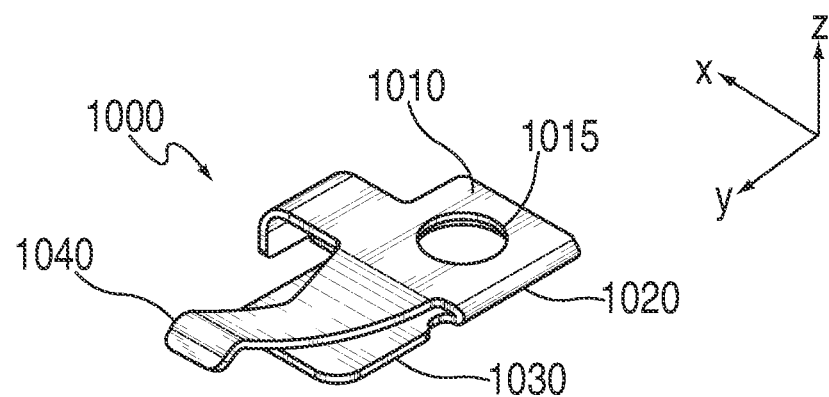
FIGS. 10A-E illustrate several different views of a multi-purpose cowling 1000 in accordance with an embodiment of the invention.
Figure 10B:
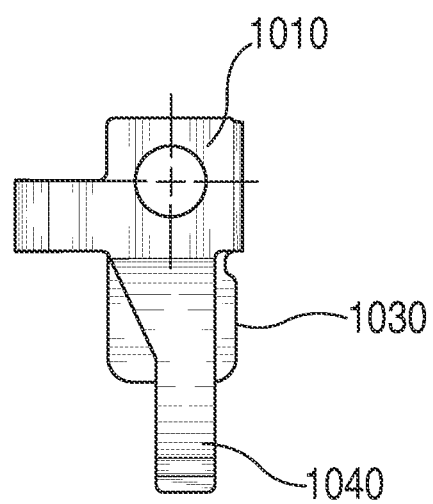
Figure 10C:
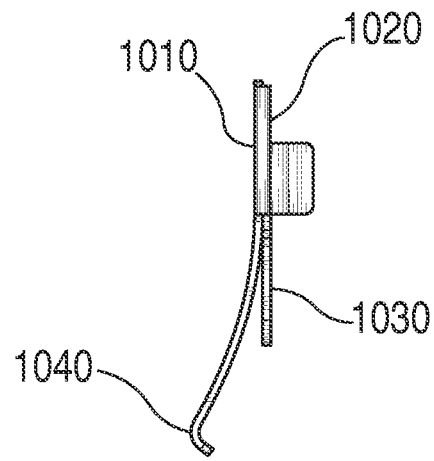
Figure 10D:
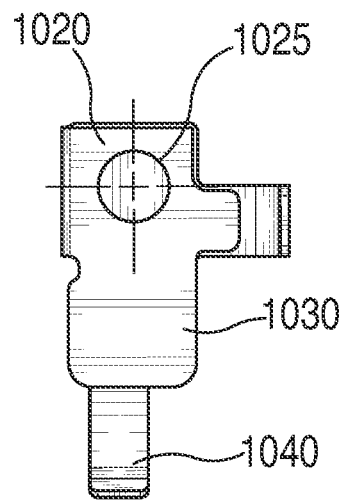
Figure 10E:
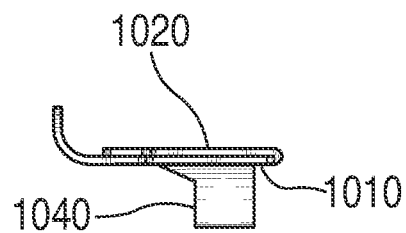
Figure 11:
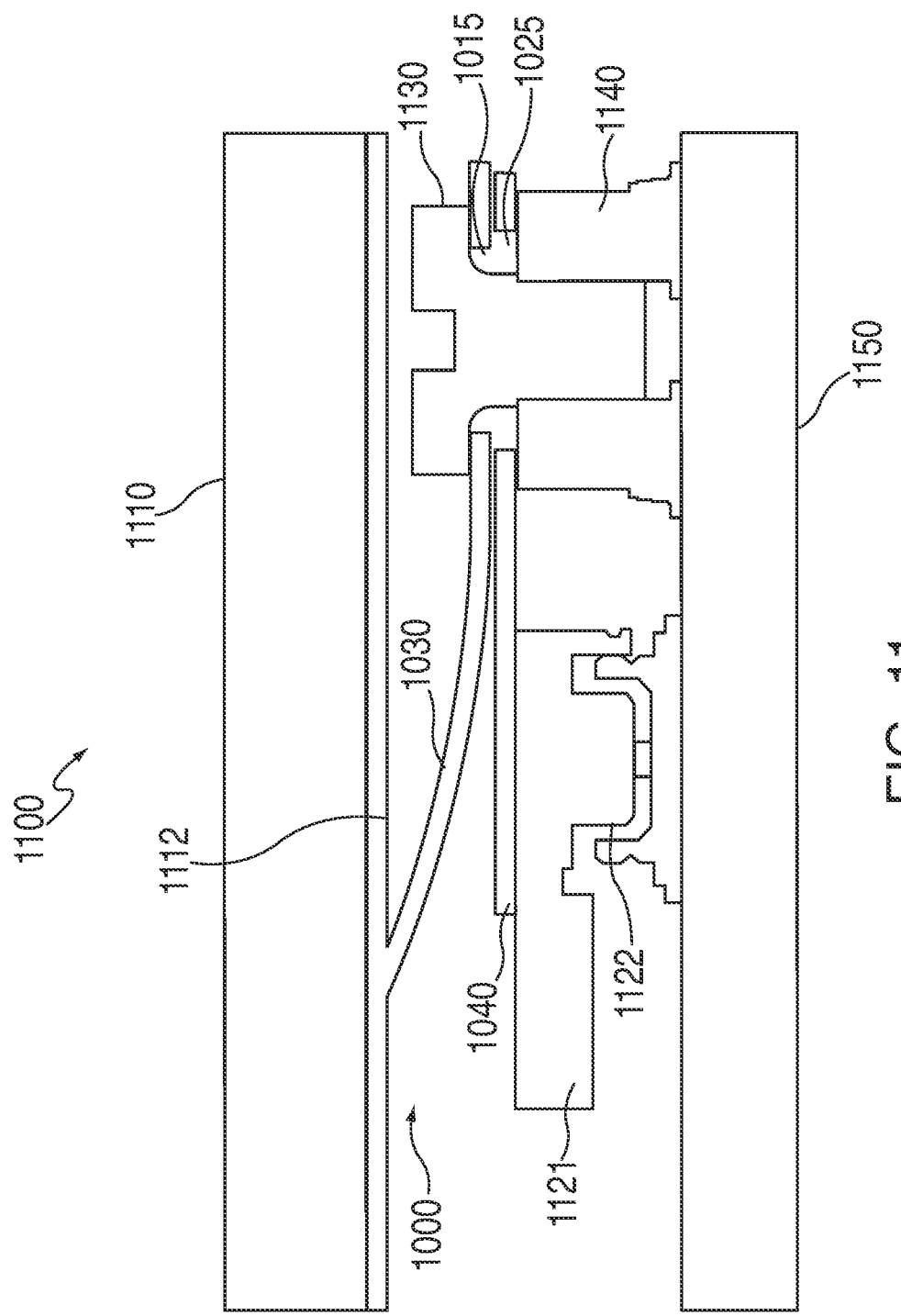
FIG. 11 shows an illustrative partial cross-sectional view of a device having a cowling mounted therein in accordance with an embodiment of the invention.

FIGS. 10-12 discuss in more detail embodiments of multi-purpose cowlings that leverage a strong, secure connection such as a threaded connection to enable the cowling to provide another connection and structural support for a less secure connection. In particular, cowlings according to embodiments of this invention are of single piece construction that provides a grounding connection as well as structural support for a connection that is not part of the cowling. The cowlings are shaped to minimize impact on board space requirements while simultaneously maximizing functional efficiency. This helps to satisfy design constraints that limit available board space while also providing strong connections such as threaded connections.

FIGS. 10A-E illustrate several different views of a multi-purpose cowling 1000 in accordance with an embodiment of the invention. In particular, FIG. 10A shows an isometric view of cowling 1000 and includes a three-dimensional Cartesian coordinate legend to help identify which direction various features of cowling 1000 extend. FIGS. 10B-E show top view, right-side view, bottom view, and front-side view, respectively, of cowling 1000. Cowling 1000 can include top and bottom planar members 1010 and 1020, which are folded on top of each other such that through-holes 1015 and 1025 are substantially co-axially aligned. Cowling 1000 can also include diving-board member 1030 and spring member 1040. Planar member 1010 is shaped to accommodate the head portion of a screw (not shown). Thus, this is the portion that enables cowling 1000 to be securely connected to a logic board (not shown) or other suitable structure by the screw.

Diving-board member 1030 extends a predetermined distance in the y-axis direction away from planar member 1020. Member 1030 can exist in the same plane as planar member 1020 and is positioned under spring member 1040. The distal end of member 1030 (the portion opposite through-hole) can be biased to exert a force in the negative z-axis direction.

Member 1030 may be manufactured to achieve this bias or it may be bent down in the negative z-axis direction by spring member 1040 when cowling 1000 is assembled in a device.

Spring member 1040 can extend a predetermined distance away from planer member 1010 in both the y-axis and z-axis directions. The distal end of member 1040 may be curved to promote, for example, interfacing potential to a ground plane. Spring member 1040 can apply a force in the z-axis direction.

FIG. 11 shows a simplified illustrative cross-sectional view of a device 1100 using cowling 1000 according to an embodiment of the invention. As shown, device 1100 includes housing member 1110, cowling 1000, co-axial cable 1120, conductor connection 1122, screw 1130, standoff 1140, and logic board 1150. Housing member 1110 can be, for example, a backplate housing assembly such as back cover assembly 260 of FIG. 2A. Housing member 1110 may be constructed with a combination of plastic and metal materials. The metal materials may provide a ground plane for device 1100. As shown in FIG. 11, housing member 1110 has ground plane interface 1112, which is a metal component connected to the ground plane.

Logic board 1150 has its own ground plane (not shown), which may be distributed in one or more layers throughout the board. In order to provide desired grounding in device 1100, the ground plane of logic board 1150 is electrically coupled to ground plane 1112 of housing member 1110. Cowling 1000 provides this electrical coupling. As shown, screw 1130 passes through the through-holes of cowling 1000 and engages standoff 1140 to physically secure cowling 1000 to logic board 1150. In some embodiments, the screw/standoff/board connection can also electrically couple the ground plane of board 1150 to cowling 1000.

When cowling 1000 is secured to board 1150, diving board 1040 is mounted flush against conductor 1121 and spring arm 1030 extends up towards housing member 1110. When housing member 1110 is installed, spring arm 1030 engages ground plane interface 1112. This completes a ground-to-ground coupling between housing member 1110 and logic board 1150. In addition, when spring arm 1030 is compressed, it applies a pre-load downforce to diving board 1040 to reinforce the coupling between conductor 1121 and logic board 1150.

Cowling 1000 advantageously provides both electrical grounding between logic board 1150 and housing member 1110 and a pre-load force as added insurance for securing a logic board connection.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. A board assembly, comprising:
    a logic board having an edge region that extends from an upper portion to a lower portion of the logic board;
    circuitry mounted to a surface of the logic board;
    a EMI shield fence disposed around a perimeter of the circuitry, the shield fence including at least one retention region that extends away from an edge of the shield fence into the edge region; and
    a co-axial cable that extends from the upper portion to the lower portion and is retained by and electrically grounded by the at least one retention region.

2. The board assembly of claim 1, further comprising a EMI shield mounted on top of the circuitry and the EMI shield fence.

3. The board assembly of claim 1, wherein the at least one retention region comprises two overhangs and a bottom hook.

4. The board assembly of claim 3, wherein the overhangs apply downward pressure on the cable to assist in retaining the cable.

5. The board assembly of claim 3, wherein cable comprises at least one barrel that is electrically coupled top a grounding wire of the cable, and wherein the bottom hook is coupled to the barrel.

6. The board assembly of claim 3, wherein the overhangs are positioned on both sides of the bottom hook and the cable is interleaved between the overhangs and bottom hook.

7. The board assembly of claim 1, wherein the at least one retention feature is a first retention feature, the EMI shield fence comprising a second retention feature that extends away from the edge of the shield fence into the edge region.

8. The board assembly of claim 7, wherein the second retention feature comprises two overhangs and a bottom hook, wherein the bottom hook electrically grounds the cable.

9. The board assembly of claim 7, wherein the second retention feature comprises a bottom hook that retains and guides the cable around a curved pathway in the edge region.

10. The board assembly of claim 1, wherein the cable is connected to the board in the upper portion and is connected to the board in the lower portion.

11. A board assembly, comprising:
    a logic board having an L shape, the board having a bend region;
    a co-axial cable that is surface mounted to the logic board at a first connection, wherein the co-axial cable can range in length between a short length and a long length;
    a bracket mounted to the board near the bend region, the bracket constructed to:
        guide the co-axial cable through the bend region;
        provide strain relief to ease strain on the first connection; and
        accommodate any length co-axial cable.

12. The board assembly of claim 11, wherein the bend region is a 90 degree bend.

13. The board assembly of claim 11, wherein the co-axial cable is soldered to the board at the first connection.

14. The board assembly of claim 11, wherein the bracket is soldered to the board.

15. The board assembly of claim 11, wherein the bracket comprises:
    a floorplate having a cable accommodation area defined by first, second, and third members, wherein
    the first member extends along a first axis of the floorplate and has a first predetermined height,
    the second member extends along a second axis of the floorplate and has a second predetermined height, and
    the third member extends along an angled portion of the floorplate and has a third predetermined height;
    a retaining member stemming from the third member and spans across a portion of the cable accommodation area.

16. The board assembly of claim 15, wherein the first and second predetermined heights are the same.

17. The board assembly of claim 15, wherein the third predetermined height is greater than the first and second predetermined heights.

18. The board assembly of claim 15, wherein the retaining member applies a downward force to the cable.

19. The board assembly of claim 15, wherein the first and second axes are orthogonal to each other.

20. The board assembly of claim 15, wherein the first member extends along the entire length of the floorplate.

21. The board assembly of claim 20, wherein the first member extends beyond a periphery of the floorplate and includes a curved portion.

22. The board assembly of claim 15, wherein the second member extends along a distal end portion of the floorplate such that a window exists between the first member and the second member.

* * * * *